United States Patent
Yamada et al.

(12)

(10) Patent No.: US 12,434,915 B2
(45) Date of Patent: Oct. 7, 2025

(54) CONVEYANCE SYSTEM

(71) Applicant: DAIFUKU CO., LTD., Osaka (JP)

(72) Inventors: Keita Yamada, Komaki (JP); Yosuke Fujiwara, Komaki (JP); Yuta Mani, Komaki (JP); Hiroyoshi Toba, Komaki (JP); Masashi Kakuma, Gamo-gun (JP); Naoya Toyoshima, Gamo-gun (JP); Kazuya Namazue, Gamo-gun (JP)

(73) Assignee: DAIFUKU CO., LTD., Osaka (JP)

( * ) Notice: Subject to any disclaimer, the term of this patent is extended or adjusted under 35 U.S.C. 154(b) by 144 days.

(21) Appl. No.: 18/329,682

(22) Filed: Jun. 6, 2023

(65) Prior Publication Data

US 2024/0017932 A1   Jan. 18, 2024

(30) Foreign Application Priority Data

Jul. 14, 2022  (JP) .................. 2022-113479

(51) Int. Cl.
*B65G 35/06* (2006.01)
*B65G 1/04* (2006.01)
*B65G 43/10* (2006.01)

(52) U.S. Cl.
CPC .......... *B65G 35/06* (2013.01); *B65G 1/0457* (2013.01); *B65G 43/10* (2013.01)

(58) Field of Classification Search
CPC ............. B65G 43/10; B65G 2201/0297; B65G 35/00; B65G 37/00; B65G 43/00; B65G 35/06; B65G 1/0457; B65G 1/00; B65G 7/02; H01L 21/67727; H01L 21/67736; H01L 21/67733; H01L 21/67706; H01L 21/67769; H01L 21/6773; H01L 21/677; H01L 21/67754; H01L 21/67757; B61B 1/005

See application file for complete search history.

(56) References Cited

U.S. PATENT DOCUMENTS

| 10,734,267 B2 * | 8/2020 | Motoori ............ H01L 21/67736 |
| 2012/0076623 A1 | 3/2012 | Kasuya |

(Continued)

FOREIGN PATENT DOCUMENTS

| CN | 111886190 B * | 6/2022 | ........... B65G 1/0457 |
| EP | 2450297 A1 * | 5/2012 | ....... H01L 21/67733 |

(Continued)

OTHER PUBLICATIONS

Japanese Office Action for Japanese Patent Application No. 2022-113479 issued on Aug. 5, 2025 and English machine translation thereof.

*Primary Examiner* — Gene O Crawford
*Assistant Examiner* — Muhammad Awais
(74) *Attorney, Agent, or Firm* — Harness, Dickey & Pierce, P.L.C.

(57) ABSTRACT

In order to achieve a conveyance system that enables efficient conveyance, a conveyance system includes a first carrier configured to travel on a first track in a state where the first carrier holds a conveyance target; and a second carrier configured to travel on a second track in a state where a conveyance target is placed on a placement portion of the second carrier, the first carrier being capable of, with use of a transfer section thereof, transferring the conveyance target between the first carrier and the placement portion of the second carrier.

8 Claims, 9 Drawing Sheets

(56) References Cited

U.S. PATENT DOCUMENTS

| | | | |
|---|---|---|---|
| 2018/0229936 A1* | 8/2018 | Motoori | B65G 1/065 |
| 2020/0010280 A1* | 1/2020 | Abe | H01L 21/67736 |
| 2022/0081207 A1* | 3/2022 | Wada | H01L 21/67733 |
| 2022/0161999 A1* | 5/2022 | Yuasa | B65G 1/0457 |
| 2022/0189807 A1* | 6/2022 | Wada | H01L 21/67736 |
| 2022/0194701 A1* | 6/2022 | Takahara | B65G 1/127 |

FOREIGN PATENT DOCUMENTS

| | | |
|---|---|---|
| JP | 2008-100835 A | 5/2008 |
| JP | 2012-66933 A | 4/2012 |
| WO | WO-2017/029873 A1 | 2/2017 |

* cited by examiner

FIG. 2
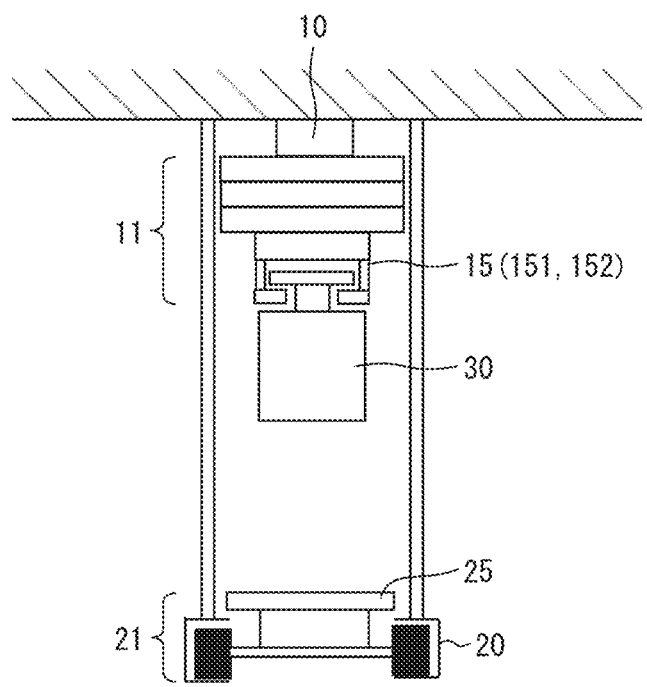
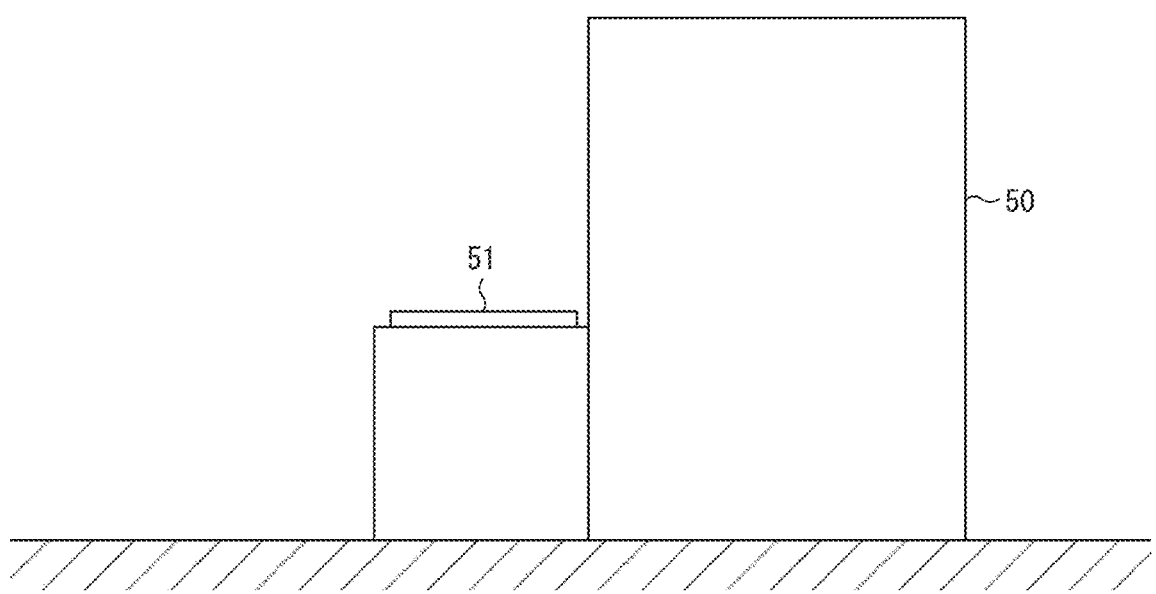

FIG. 3
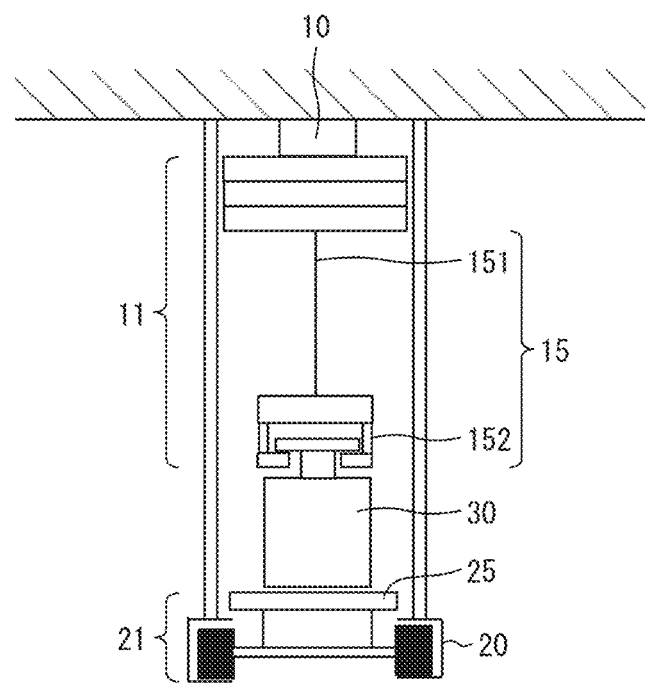
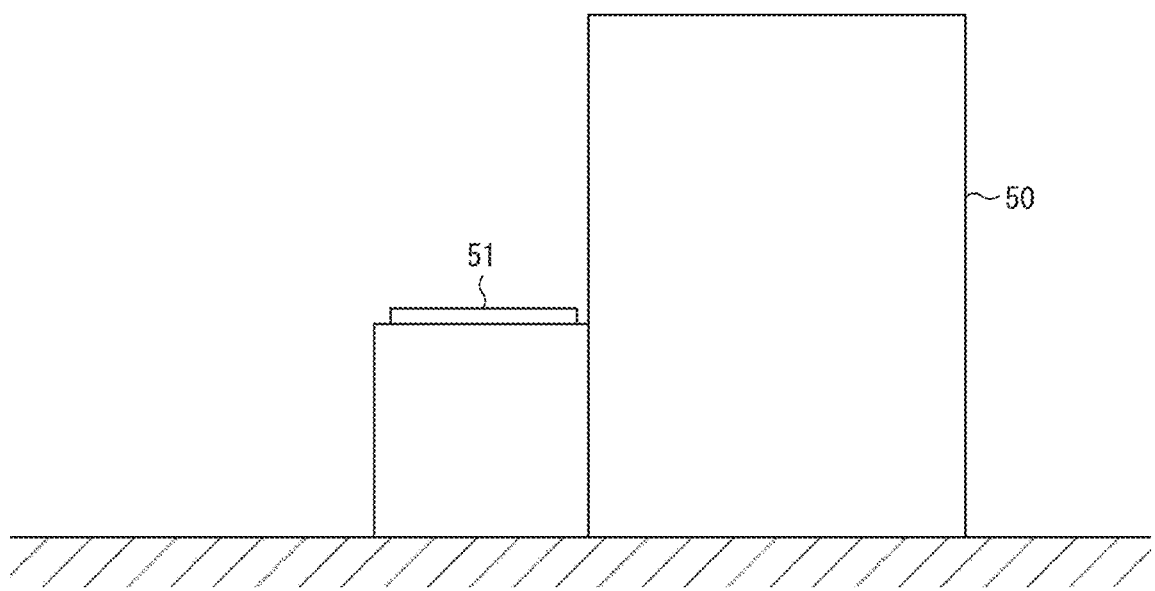

FIG. 4
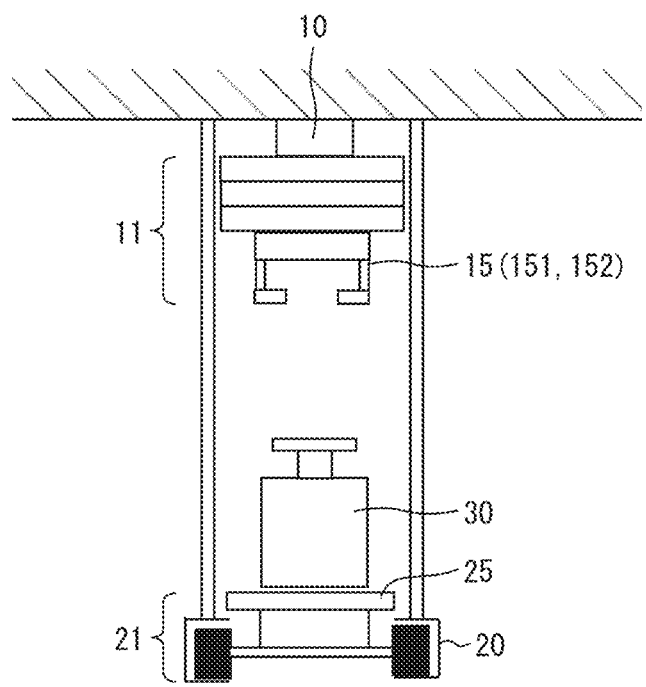
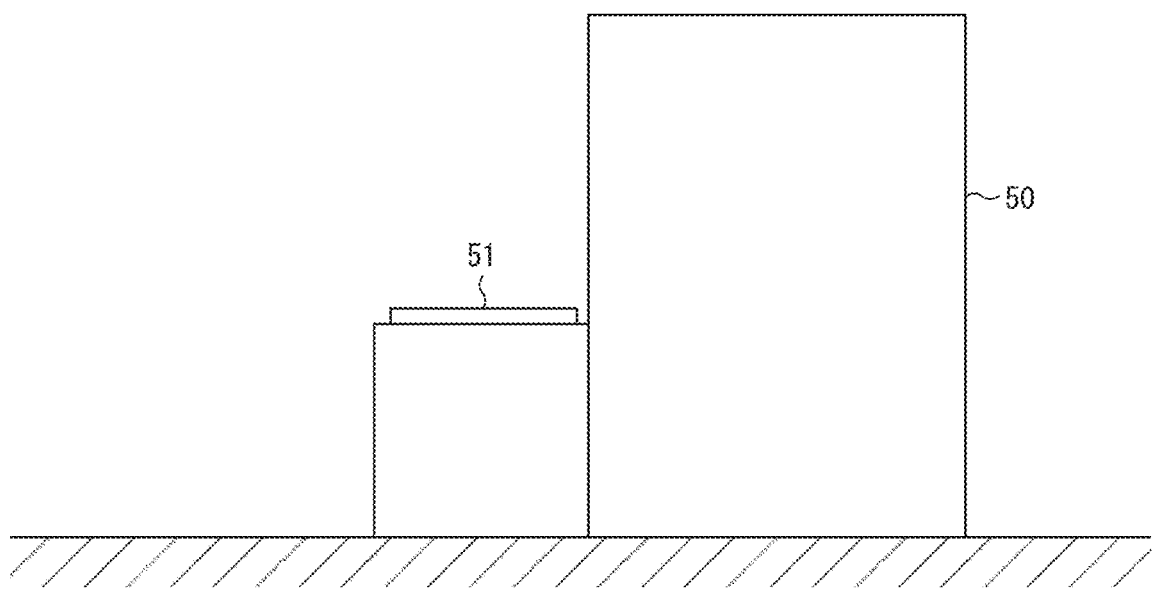

FIG. 7
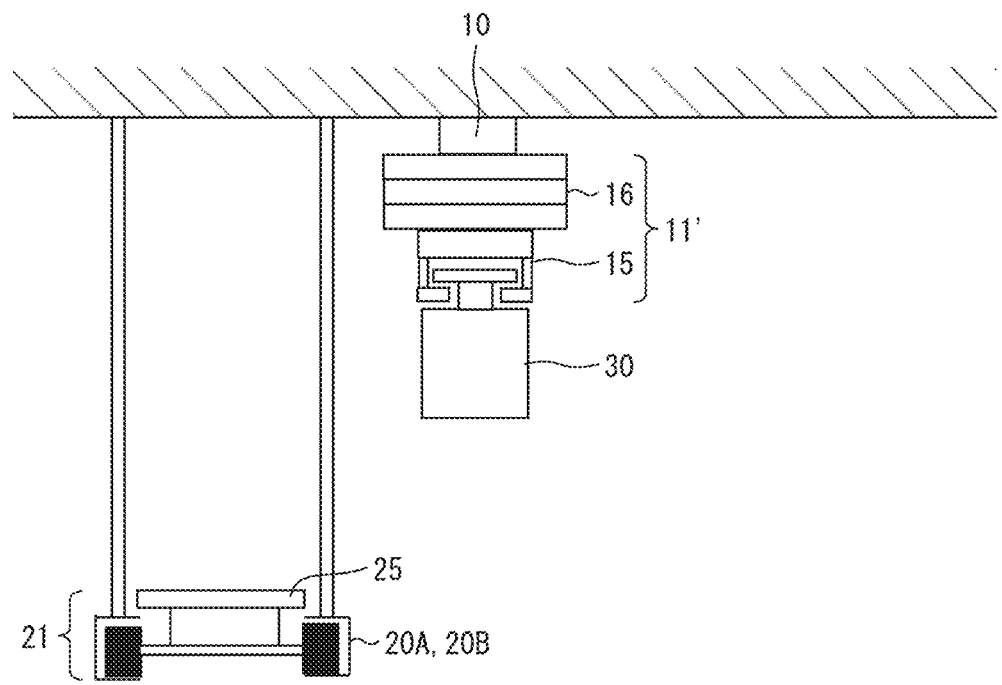
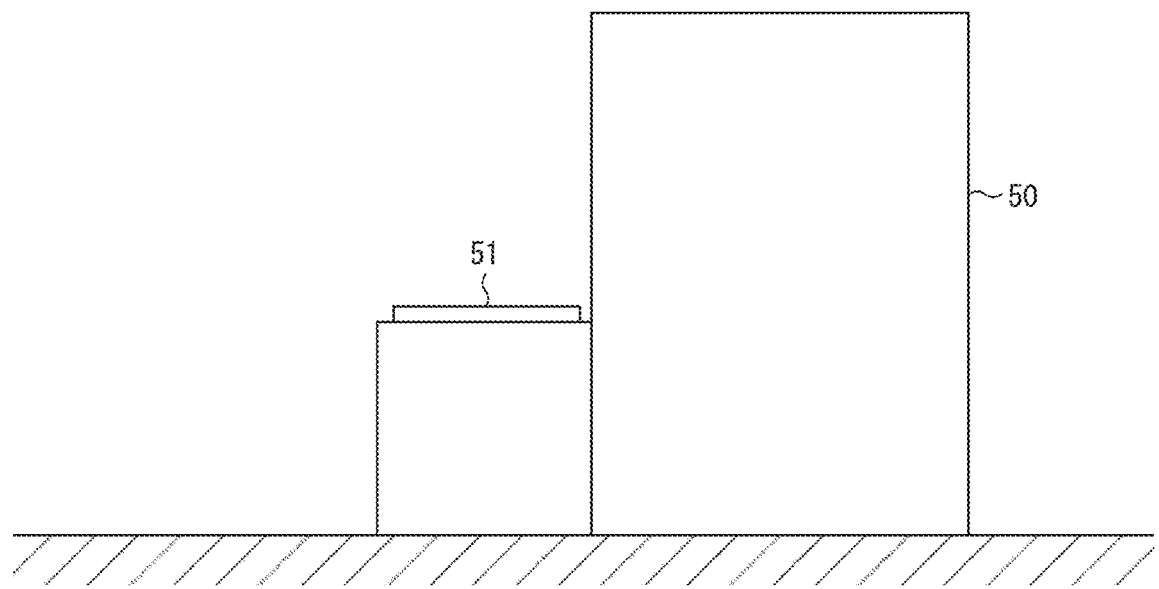

FIG. 8
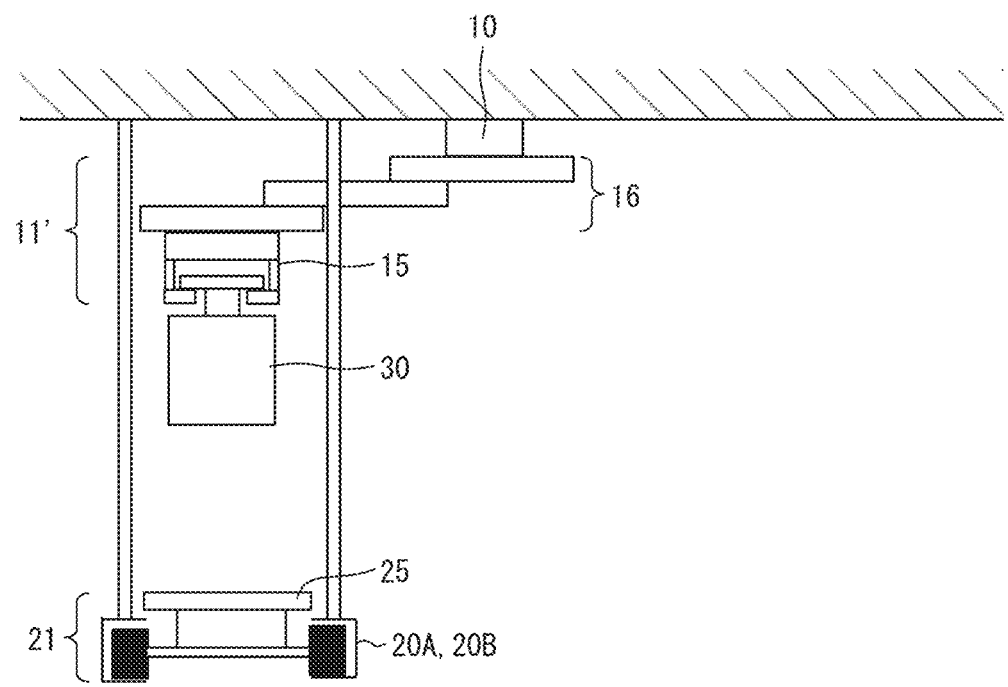
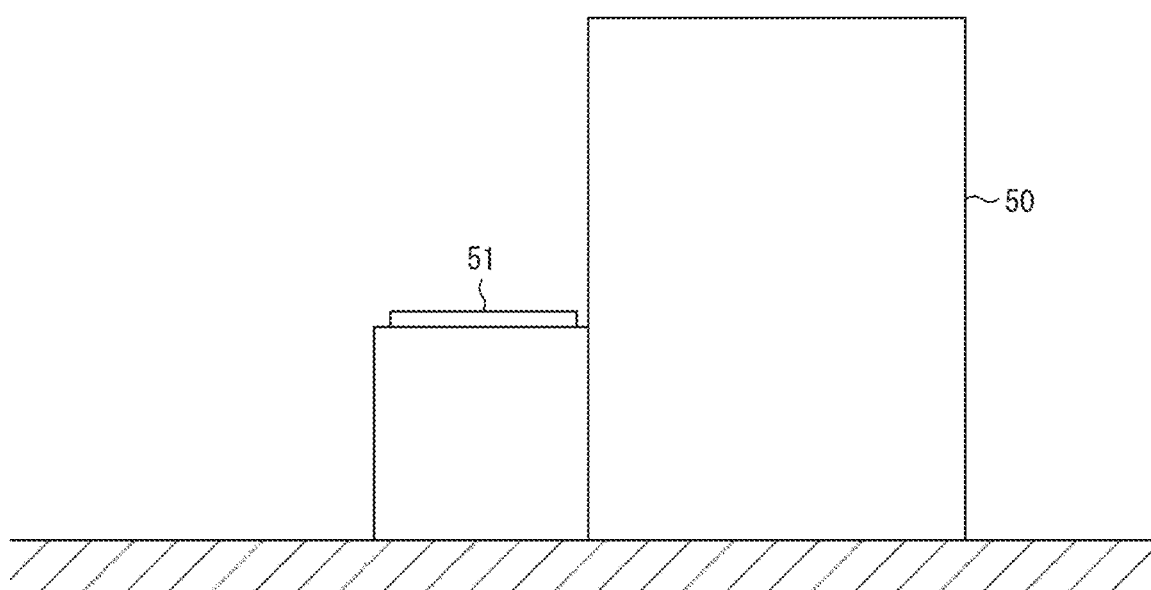

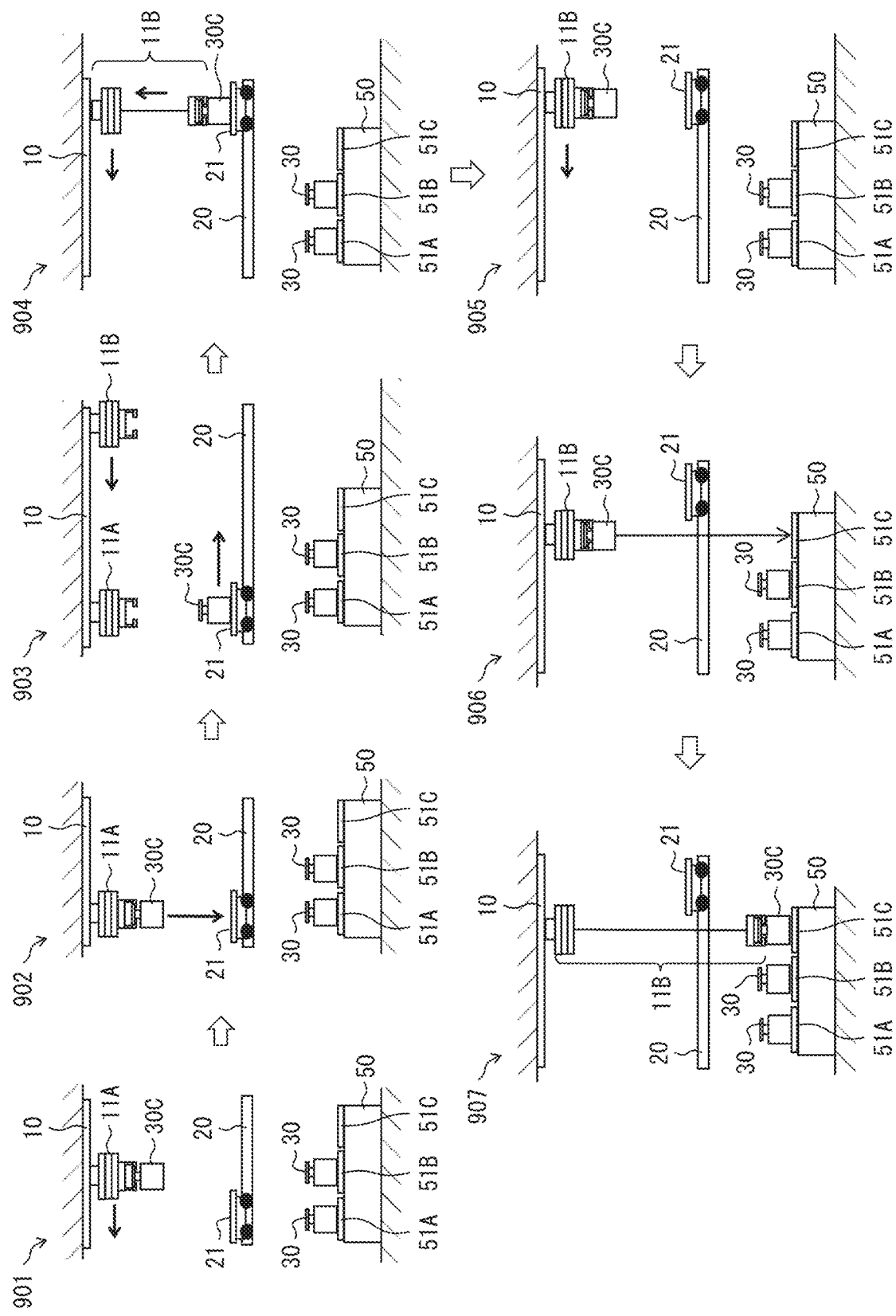

CONVEYANCE SYSTEM

This Nonprovisional application claims priority under U.S.C. § 119 on Patent Application No. 2022-113479 filed in Japan on Jul. 14, 2022, the entire contents of which are hereby incorporated by reference.

TECHNICAL FIELD

The present invention relates to a conveyance system that conveys a conveyance target with use of a carrier.

BACKGROUND ART

Known is a system that conveys a conveyance target by causing a carrier to travel along a track disposed on a ceiling. For example, Patent Literature 1 discloses a carrier system including: a first carrier that travels on a lower track in one direction; and a second carrier that travels on an upper track in one direction. The carrier system disclosed in Patent Literature 1 enables transfer of a conveyance target between the first carrier and the second carrier via a first transfer section and a second transfer section.

CITATION LIST

Patent Literature

[Patent Literature 1]
International Publication No. WO 2017/029873

SUMMARY OF INVENTION

Technical Problem

In such a conventional technique described above, transfer of conveyance target between the first carrier and the second carrier transfer is carried out via the first transfer section or the second transfer section, and the conventional technique has a room for improvement in efficiency of the conveyance.

An aspect of the present invention has been achieved in light of the foregoing problem. It is an object of the aspect of the present invention to achieve a conveyance system that enables efficient conveyance.

Solution to Problem

In order to solve the foregoing problem, a conveyance system in accordance with an aspect of the present invention includes: a first track; a first carrier including a transfer section configured to transfer a conveyance target between the first carrier and a desired place, the first carrier being configured to travel on the first track in a state where the first carrier holds the conveyance target; a second track; and a second carrier including a placement portion on which the conveyance target is to be placed, the second carrier being configured to travel on the second track in a state where the conveyance target is placed on the placement portion, the first carrier being capable of transferring the conveyance target between the first carrier and the placement portion of the second carrier with use of the transfer section.

Advantageous Effects of Invention

According to an aspect of the present invention, it is possible to efficiently convey a conveyance target to a desired position.

BRIEF DESCRIPTION OF DRAWINGS

FIG. 2 is a front view as seen from line A-A in FIG. 1.

FIG. 3 is a view illustrating a state in which a conveyance target is being transferred from a first carrier to a second carrier in FIG. 2.

FIG. 4 is a view illustrating a state in which the conveyance target has been transferred to the second carrier in FIG. 2.

FIG. 7 is a front view as seen from line B-B in FIG. 6.

FIG. 8 is a view illustrating a state in which a conveyance target is being transferred from a first carrier to a second carrier in FIG. 7.

FIG. 9 is a view for describing an effect of a conveyance system.

DESCRIPTION OF EMBODIMENTS

Embodiment 1

Overview

Figure 1:
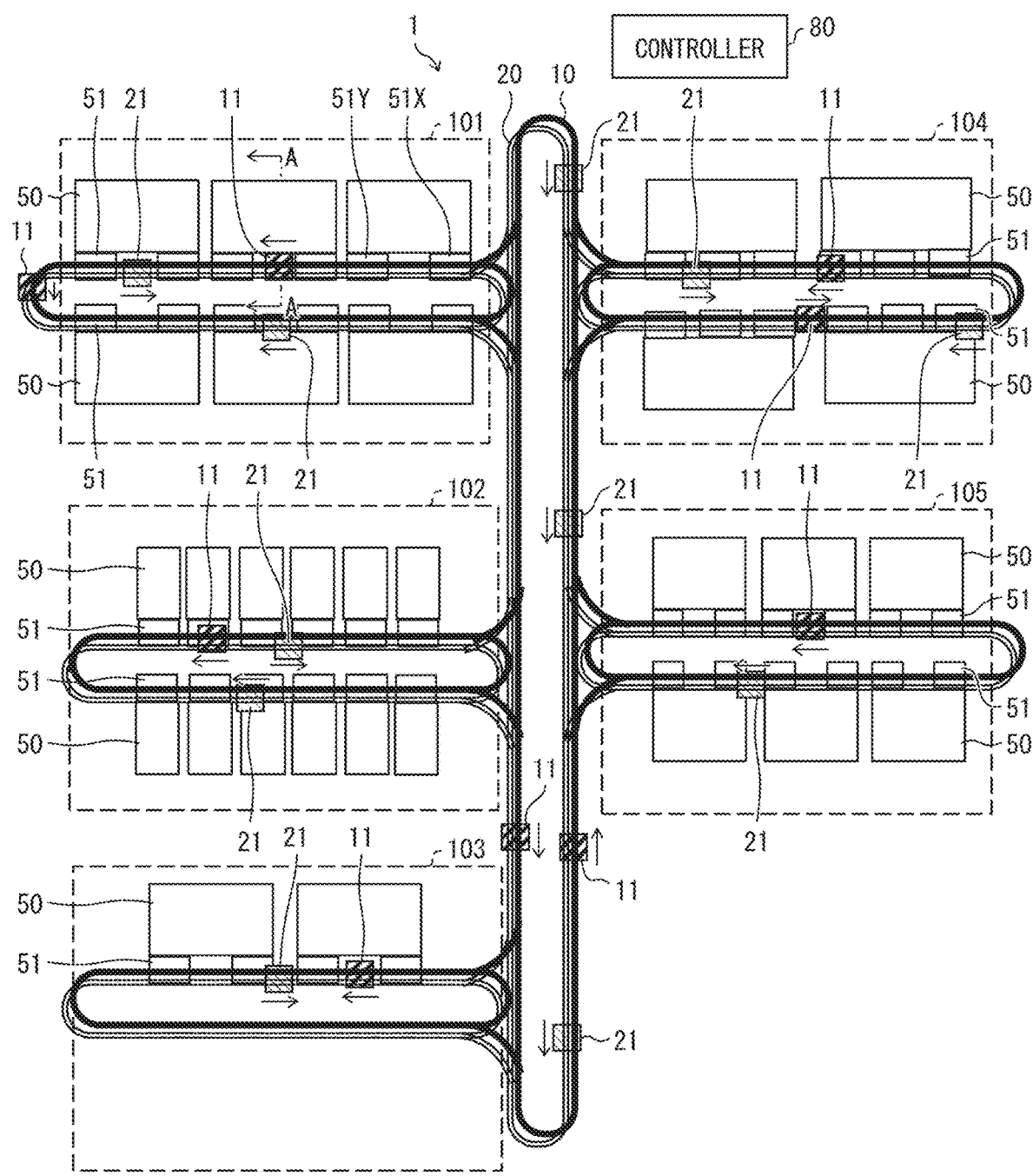
FIG. 1 is a view illustrating a layout of tracks in a conveyance system in accordance with Embodiment 1 of the present invention.

The following will describe an embodiment of the present invention in detail. First, with reference to FIG. 1, an overview of a conveyance system 1 will be described. FIG. 1 is a view illustrating a layout of tracks for carriers in the conveyance system 1. FIG. 1 illustrates the conveyance system 1 as seen from above in a vertical direction. Note that, in FIG. 1, a first track 10 and a second track 20 are, for easier understanding of the layout, depicted such that the positions thereof are shifted from each other, but, in Embodiment 1, the second track 20 is disposed immediately below the first track 10 in a vertical direction.

The conveyance system 1 conveys a conveyance target 30 across conveyance areas (in Embodiments 1 and 2, referred to as bays) in which a plurality of processing devices 50 are disposed that perform identical or similar processes. The conveyance system 1 performs the conveyance with use of carriers, which are one or more first carriers 11 and one or more second carriers 21, capable of traveling along tracks, which are the first track 10 and the second track 20.

In an example illustrated in FIG. 1, five bays, which are a first bay 101 to a fifth bay 105 are depicted as the conveyance areas. The first track 10 and the second track 20 are each disposed such that the conveyance target 30 can be conveyed across the area from the first bay 101 to the fifth bay 105. The first carriers 11 travel along the first track 10, and the second carriers 21 travel along the second track 20, so that the conveyance target 30 is conveyed.

Each of the bays from the first bay 101 to the fifth bay 105 includes the plurality of processing devices 50. In addition, each of the processing devices 50 is provided with one or more device ports 51. Onto each of the device ports 51 of the processing device 50, the conveyance target 30 to be processed by the processing device 50 is to be placed.

The first track 10 is disposed along a ceiling, and the second track 20 is disposed on a side lower than the first track 10 in a vertical direction. Thus, the first carriers 11 that travel along the first track 10 are ceiling carriers. Further, the first track 10 and the second track 20 each include: a circular route; and routes each of which branches from the circular route and each of which passes through the processing devices 50 in each of the bays (from the first bay 101 to the fifth bay 105) and returns to the circular route. By virtue of the first track 10 and the second track 20 each including such a circular route, the plurality of first carriers 11 and the plurality of second carriers 21 can be positioned on the first track 10 and the second track 20, respectively.

The first carriers 11 travel along the first track 10 in one direction, and the second carriers 21 travel along the second track 20 in one direction. Further, a direction in which the first carriers 11 travel is opposite to a direction in which the second carriers 21 travel. That is, for example, in an example illustrated in FIG. 1, in a case where the first carriers 11 pass the device port 51X and the device port 51Y in this order, the second carriers 21 pass the device port 51Y and the device port 51X in this order.

The first carriers 11 and the second carriers 21 travel in the directions opposite to each other, so that each of the second carriers 21 can convey the conveyance target 30 in a direction opposite to the direction in which each of the first carriers 11 conveys the conveyance target 30. This makes it possible to improve the efficiency of conveying the conveyance target 30.

In addition, the first carrier 11 conveys the conveyance target 30 in a state where the first carrier 11 grips the conveyance target 30 with use of a gripping part 152 (described later). The second carrier 21 includes a placement portion 25 so that the second carrier 21 conveys the conveyance target 30 placed on the placement portion 25.

The conveyance system 1 includes a controller 80. The controller 80 is a section configured to perform various control processes for the entire conveyance system 1 and is, for example, an electronic control unit including a central processing unit (CPU), a read only memory (ROM), a random access memory (RAM), and the like. The controller 80 controls, for example, the travel of the first carrier 11, the travel of the second carrier 21, the transfer of the conveyance target 30 from the first carrier 11 to the second carrier 21, the transfer of the conveyance target 30 from the first carrier 11 to the device port 51, and the transfer of the conveyance target 30 from the device port 51 to the first carrier 11.

For example, when a conveyance target 30 is assigned to be conveyed, the controller 80 controls an appropriate first carrier 11 to cause the first carrier 11 to travel to an appropriate position.

Further, in a case where the controller 80 has caused a first carrier 11 to travel past a desired device port 51 on which a conveyance target 30 conveyed by the first carrier 11 is to be placed, the controller 80 causes the conveyance target 30 to be transferred from the first carrier 11 to a second carrier 21 at a position where the first carrier 11 has stopped after traveling past the desired device port 51. Then, the controller 80 causes the second carrier 21 that has received the conveyance target 30 to travel in a direction opposite to the direction in which the first carrier 11 travels and travel past the desired device port 51. After that, the controller 80 causes the conveyance target 30 to be transferred from the second carrier 21 to another first carrier 11. Then, the controller 80 causes the another first carrier 11 that has received the conveyance target 30 to travel in a direction opposite to the direction in which the second carrier 21 travels, and causes the conveyance target 30 to be transferred to the desired device port 51.

Furthermore, in a case where one conveyance target 30 is placed on a device port 51 of destination to which another conveyance target 30 being conveyed by the first carrier 11 is to be conveyed, the controller 80 may cause the another conveyance target 30 to be temporarily transferred from the first carrier 11 to the second carrier 21. This allows the second carrier 21 to serve as a buffer for the device port 51.

First Carrier 11 and Second Carrier 21

FIG. 2 is a front view as seen from line A-A in FIG. 1. As illustrated in FIG. 2, the first carrier 11 includes a transfer section 15. The transfer section 15 includes a raising and lowering part 151 and a gripping part 152. The transfer section 15 can transfer the conveyance target 30 to the second carrier 21 or the device port 51 by griping the conveyance target 30 with use of the gripping part 152 and by raising and lowering the conveyance target 30 with use of the raising and lowering part 151. That is, the first carrier 11 can transfer the conveyance target 30 directly to the second carrier 21 and can transfer the conveyance target 30 directly to the device port 51. That is, the first carrier 11 includes the transfer section 15 which transfers the conveyance target 30 between the first carrier 11 and a desired place (for example, the device port 51). In addition, the first carrier 11 can transfer the conveyance target 30 between the first carrier 11 and the placement portion 25 of the second carrier 21 with use of the transfer section 15.

The transfer of the conveyance target 30 between the first carrier 11 and the second carrier 21 is carried out while the first carrier 11 and the second carrier 21 are stopped.

The second carrier 21 includes the placement portion 25. Unlike the first carrier 11, the second carrier 21 does not include a transfer section such as the transfer section 15. This enables the second carrier 21 to have a weight lighter than that of the first carrier 11, and to have a conveyance speed higher than that of the first carrier 11.

FIGS. 3 and 4 are views illustrating a state where the conveyance target 30 is being transferred to the second carrier 21 in an example illustrated in FIG. 2. In a state where the second carrier 21 is positioned immediately below the first carrier 11, as illustrated in FIG. 3, the conveyance target gripped by the gripping part 152 of the first carrier 11 is lowered downward in a vertical direction by the raising and lowering part 151 and is placed onto the placement portion 25 of the second carrier 21. Subsequently, as illustrated in FIG. 4, the gripping part 152 returns to the first carrier 11, and only the conveyance target 30 is placed on the second carrier 21. In this state, the second carrier 21 conveys the conveyance target 30.

Figure 5:
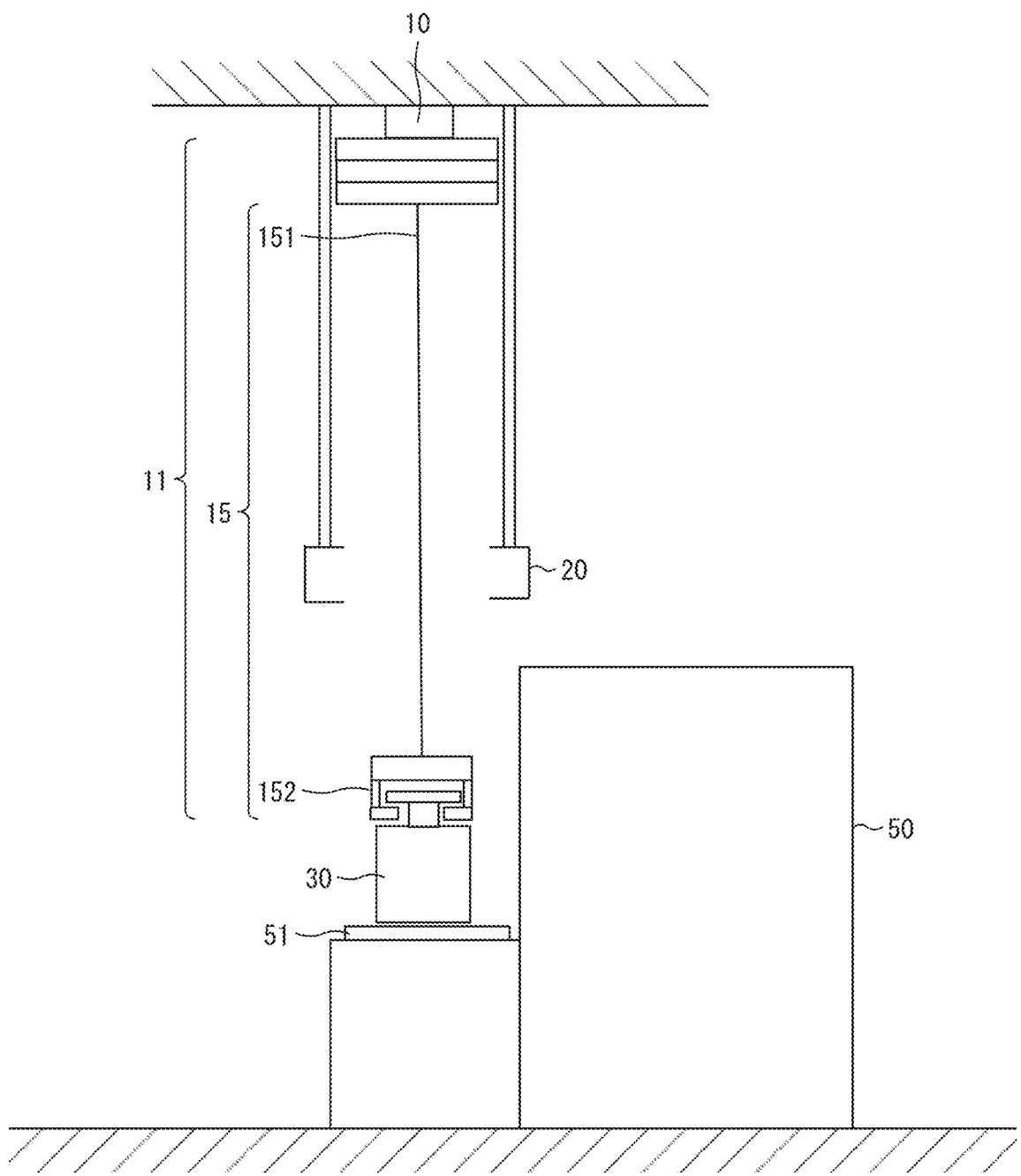
FIG. 5 is a view illustrating a state in which the conveyance target is being transferred to a device port in FIG. 2.

FIG. 5 is a view illustrating a state in which the conveyance target 30 is being placed onto the device port 51. In a case where the conveyance target 30 is placed onto the device port 51, the conveyance target 30 gripped by the gripping part 152 of the first carrier 11 is lowered downward in a vertical direction by the raising and lowering part 151 and is placed onto the device port 51. Note that, as described above, the transfer section 15 is provided only to the first carrier 11 and is not provided to the second carrier 21. Thus, the conveyance target 30 placed on the second carrier 21 cannot be transferred directly to the device port 51.

As described above, the conveyance system 1 includes: the first track 10; and the one or more first carriers 11 each of which includes the transfer section 15 that transfers the conveyance target 30 between the first carrier 11 and a desired place and each of which is configured to travel on the first track 10 in a state where the first carrier 11 holds the conveyance target 30. In addition, the conveyance system 1 includes: the second track 20; and the one or more second carriers 21 each of which includes the placement portion 25 on which the conveyance target 30 is to be placed and each of which is configured to travel on the second track 20 in a state where the conveyance target 30 is placed on the placement portion 25. In the conveyance system 1, the first carrier 11 is capable of transferring the conveyance target between the first carrier 11 and the placement portion 25 of the second carrier 21 with use of the transfer section 15.

This enables direct transfer of the conveyance target between the first carrier 11 and the second carrier 21, so that it is possible to improve the efficiency of conveying the conveyance target 30.

Embodiment 2

Figure 6:
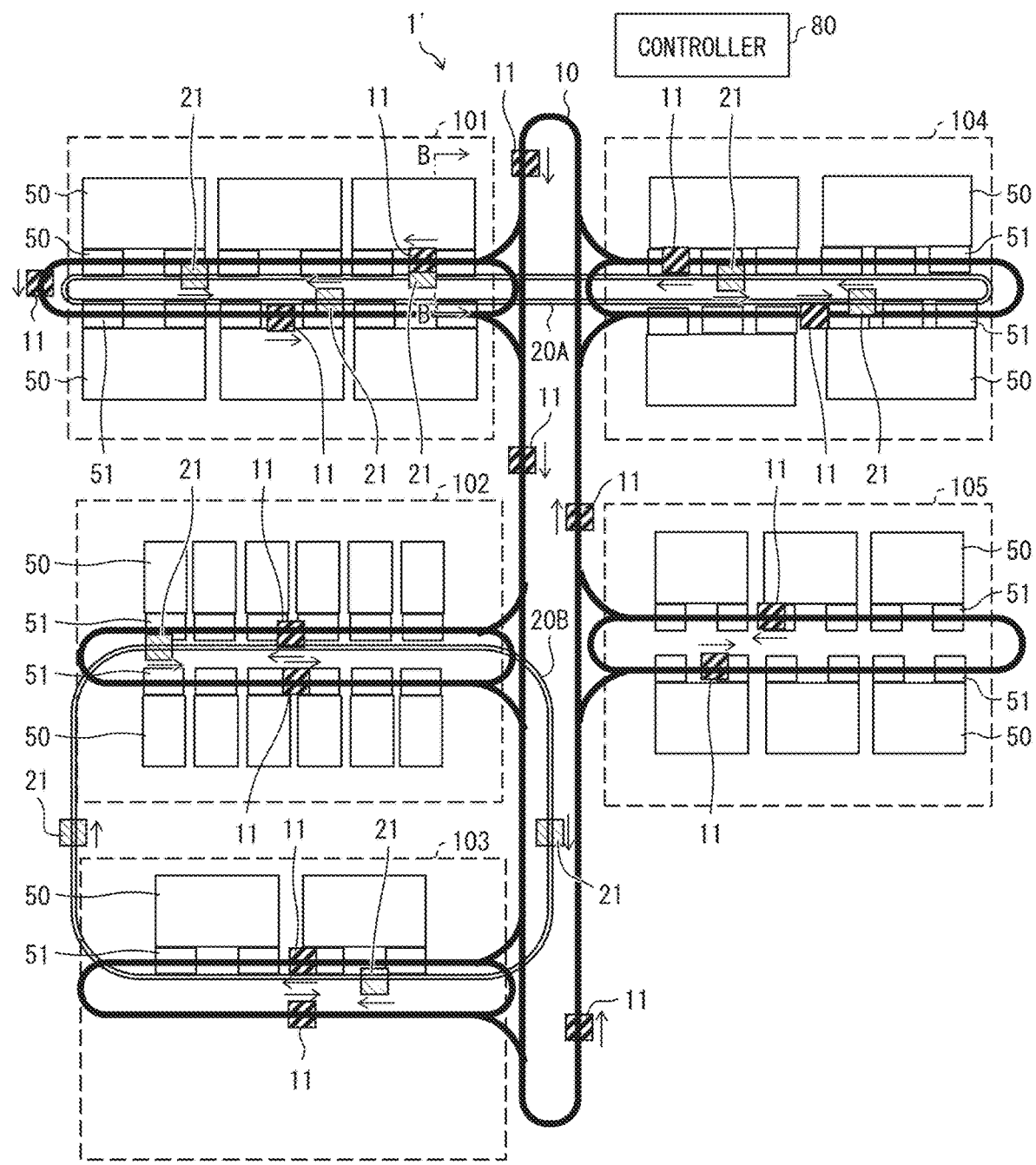
FIG. 6 is a view illustrating a layout of tracks in a conveyance system in accordance with Embodiment 2 of the present invention.

The following will describe another embodiment of the present invention. Note that, for convenience of description, a member having a function identical to that of a member discussed in the embodiment above is given an identical reference sign, and a description thereof is omitted.
Overview First, with reference to FIG. 6, the following will describe an overview of a conveyance system 1' in accordance with Embodiment 2. FIG. 6 is a view illustrating a layout of tracks for carriers in the conveyance system 1'. FIG. 6 is a view illustrating the conveyance system 1' as seen from above in a vertical direction. A first track 10 of the conveyance system 1' is identical to the first track 10 described in Embodiment 1 above. In the conveyance system 1', a second track 20A and a second track 20B are provided instead of the second track 20 of the conveyance system 1. The second track 20A is a circular route that connects a first bay 101 and a fourth bay 104. In addition, the second track 20B is a circular route that connects a second bay 102 and a third bay 103.

The second track 20A and the second track 20B are each disposed not immediately below the first track 10 in a vertical direction, but at a position shifted from the position immediately below the first track 10 in a vertical direction.

Specifically, in Embodiment 2, there are a plurality of bays (a first bay 101, a second bay 102, a third bay 103, a fourth bay 104, and a fifth bay 105) each of which includes a plurality of processing devices 50, and a combination of bays across which the first track 10 runs (the first bay 101, the second bay 102, the third bay 103, the fourth bay 104, and the fifth bay 105), a combination of bays across which the second track 20A runs (the first bay 101 and the fourth bay 104), and a combination of bays across which the second track 20B runs (the second bay 102 and the third bay 103) are different from each other.

For example, in a case where conveyance between the first bay 101 and the fourth bay 104 is frequently performed, traveling on the second track 20A which is routed to run across only the first bay 101 and the fourth bay 104 achieves efficient conveyance as compared with traveling on the first track 10. This also achieves relief from congestion of first carriers 11 that travel on the first track 10.

Similarly, in a case where conveyance between the second bay 102 and the third bay 103 is frequently performed, traveling on the second track 20B which is routed to run across only the second bay 102 and the third bay 103 achieves efficient conveyance as compared with traveling on the first track 10. This also achieves relief from congestion of first carriers 11 that travel on the first track 10.

First Carrier 11' and Second Carrier 21

FIG. 7 is a front view as seen form line B-B in FIG. 6. As illustrated in FIG. 7, the first carrier 11' includes a transfer section 15 and a slide mechanism 16. The transfer section 15 includes a raising and lowering part 151 and a gripping part 152. The slide mechanism 16 is a mechanism that causes the transfer section 15 to slide (move) in a horizontal direction. With the slide mechanism 16 provided in the first carrier 11', the first carrier 11' can transfer a conveyance target 30 to a second carrier 21 that is not positioned immediately below the first carrier 11' in a vertical direction. This will be described in more detail with reference to FIG. 8.

FIG. 8 is a view illustrating a state where the conveyance target 30 is being transferred to the second carrier 21 in an example illustrated in FIG. 7. As illustrated in FIG. 8, the slide mechanism 16 causes a conveyance target gripped by the gripping part 152 of the first carrier 11' to move to a position immediately above a placement portion 25 of the second carrier 21. The conveyance target 30 is then lowered downward in a vertical direction by the raising and lowering part 151 and is placed onto the placement portion of the second carrier 21. Accordingly, the second carrier 21 can convey the conveyance target 30.

Effects of Embodiments 1 and 2

As described above, the conveyance system 1 in accordance with Embodiment 1 and the conveyance system 1' in accordance with Embodiment 2 enable transfer of a conveyance target 30 respectively from the first carrier 11 and the first carrier 11' to the second carrier 21. In addition, the first carriers 11 and 11' move in a direction opposite to the direction in which the second carrier 21 moves. This makes it possible to efficiently place the conveyance target 30 onto the device port 51.

With reference to FIG. 9, the following will describe effects of Embodiments 1 and 2. FIG. 9 is a view for illustrating effects of the conveyance systems 1 and 1'. FIG. 9 is a view, as seen laterally with respect to directions in which first carriers 11A and 11B and a second carrier 21 travel, illustrating a positional relationship of the first carriers 11A and 11B, the second carrier 21, and device ports 51 (51A, 51B, and 51C).

As indicated as 901 in FIG. 9, assume that, in a situation where a conveyance target 30C is to be placed onto any one of three device ports 51A, 51B, and 51C of a processing device 50, a conveyance target 30 is already placed on the device port 51A and the device port 51B.

In this case, the first carrier 11A needs to place the conveyance target 30C onto the device port 51C. However, in a case where the first carrier 11A has traveled past the device port 51C, typically, the first carrier 11A needs to travel around a circular route of a first track 10 once to arrive at the device port 51C again.

However, each of the conveyance systems 1 and 1' in accordance with Embodiments 1 and 2 respectively includes the second carrier 21 that travels in a direction opposite to the direction in which the first carrier 11A travels, and thus the first carrier 11A can transfer the conveyance target 30C to the second carrier 21 at a position where the first carrier 11A has stopped after traveling past the device port 51C (902 in FIG. 9). Then, the second carrier 21 to which the conveyance target 30C has been transferred travels in a direction opposite to the direction in which the first carrier 11A travels (903 in FIG. 9), and after the second carrier 21 has traveled past the device port 51C, the conveyance target 30C is transferred, by a first carrier 11B, which is other than the first carrier 11A, to the first carrier 11B (904 in FIG. 9). The first carrier 11B that has received the conveyance target 30C travels toward the device port 51C (905 in FIG. 9) and, on arrival at the device port 51C (906 in FIG. 9), places the conveyance target 30C onto the device port 51C (907 in FIG. 9).

Thus, according to the conveyance systems 1 and 1' in accordance with Embodiments 1 and 2 respectively, it is possible to, even in a case where the first carrier 11A has traveled past a desired placement place, efficiently place the conveyance target 30 onto the desired placement place without traveling around the circular route of the first track after having traveled past the desired placement place.

Further, for example, in a case where the conveyance target 30C cannot be immediately placed onto the desired device port 51C since the conveyance target 30 has been placed on the desired device port 51C, the conveyance target 30C can be temporarily placed on the second carrier 21 until the device port 51C becomes available. In other words, the second carrier 21 can serve as a buffer for the device port 51. This is useful particularly in a case where a circular route, like the second track 20A and the second track 20B, which is shorter than the circular route of the first track 10 is employed. This is because the conveyance target 30 placed on a carrier which travels along such a circular route can return to a desired device port 51 in a short time.

Aspects of the present invention can also be expressed as follows:

A conveyance system according to Aspect 1 of the present invention includes: a first track; a first carrier including a transfer section configured to transfer a conveyance target between the first carrier and a desired place, the first carrier being configured to travel on the first track in a state where the first carrier holds the conveyance target; a second track; and a second carrier including a placement portion on which the conveyance target is to be placed, the second carrier being configured to travel on the second track in a state where the conveyance target is placed on the placement portion, the first carrier being capable of transferring the conveyance target between the first carrier and the placement portion of the second carrier with use of the transfer section.

According to the above configuration, it is possible to transfer a conveyance target directly between the first carrier and the second carrier. This makes it possible to efficiently convey the conveyance target.

A conveyance system according to Aspect 2 of the present invention may be configured, in Aspect 1, such that: the first track is a circular route; the second track includes a circular route; and the first carrier travels in a direction opposite to a direction in which the second carrier travels.

According to the above configuration, the first carrier and the second carrier travel in directions opposite to each other. Thus, transferring a conveyance target between the first carrier and the second carrier makes it possible to convey the conveyance target in an opposite direction. This makes it possible to improve the conveyance efficiency.

A conveyance system according to Aspect 3 of the present invention may be configured, in Aspect 1 or 2, such that the first carrier is a ceiling carrier for which the first track is disposed in a vicinity of a ceiling.

According to the above configuration, it is possible to allow the first carrier to serve as a ceiling carrier.

A conveyance system according to Aspect 4 of the present invention may be configured, in Aspect 3, such that the second track is disposed on a side lower than the first track in a vertical direction.

According to the above configuration, it is possible to easily transfer a conveyance target between the first carrier and the second carrier.

A conveyance system according to Aspect 5 of the present invention may be configured, in any one of Aspects 1 to 4, such that the first carrier is configured to, in a case where one conveyance target is placed on the desired place to which another conveyance target being conveyed by the first carrier is to be conveyed, temporarily transfer the another conveyance target to the second carrier.

According to the above configuration, it is possible to prevent decrease in conveyance efficiency due to standby time of a first carrier that cannot drop off a conveyance target onto a desired place. Thus, it is possible to convey a conveyance target to a desired place while efficiently operating the first carrier.

A conveyance system according to Aspect 6 of the present invention may be configured, in any one of Aspects 1 to 5, such that the second track is disposed at a position shifted from a position immediately below the first track in a vertical direction.

According to the above configuration, it is possible to freely set the layout of the first track and the second track, and thus it is possible to efficiently use a conveyance space. Further, the second track is located at a position shifted from a position immediately below the first track, and thus it is possible to easily transfer a conveyance target directly to a desired place (for example, a device port) from the first carrier which travels on the first track.

A conveyance system according to Aspect 7 of the present invention may be configured, in any one of Aspects 1 to 6, such that the transfer section includes a slide mechanism configured to allow the conveyance target to move in a horizontal direction.

According to the above configuration, it is possible to transfer a conveyance target from the first carrier to a position except immediately below the first carrier.

A conveyance system according to Aspect 8 of the present invention may be configured, in any one of Aspects 1 to 7, such that, among a plurality of conveyance areas each of which includes a plurality of processing devices, a combination of conveyance areas across which the first track runs differs from a combination of conveyance areas across which the second track runs.

According to the above configuration, it is possible to efficiently convey a conveyance target with use of the first track and the second track.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

1 Conveyance system
10 First track
11 First carrier
15 Transfer section
151 Raising and lowering part 152 Gripping part
16 Slide mechanism
20 Second track
21 Second carrier
25 Placement portion
30 Conveyance target
50 Processing device
51 Device port
80 Controller
101 First bay
102 Second bay
103 Third bay
104 Fourth bay
105 Fifth bay

The invention claimed is:

1. A conveyance system comprising:
a first track;
a first carrier including a transfer section configured to transfer a conveyance target between the first carrier and a desired place, the first carrier being configured to travel on the first track in a state where the first carrier holds the conveyance target;
a second track; and
a second carrier including a placement portion on which the conveyance target is to be placed, the second carrier being configured to travel on the second track in a state where the conveyance target is placed on the placement portion,
the first carrier being capable of directly transferring the conveyance target between the first carrier and the placement portion of the second carrier with use of the transfer section,
a layout configuration of the first track and a layout configuration of the second track at least partially coinciding, in a part where the layout configuration of the first track and the layout configuration of the second track at least partially coincide, the first carrier and the second carrier travelling in opposite directions to each other.

2. The conveyance system according to claim 1, wherein:
the first track is a circular route; and
the second track includes a circular route.

3. The conveyance system according to claim 1, wherein:
the first carrier is a ceiling carrier for which the first track is disposed in a vicinity of a ceiling.

4. The conveyance system according to claim 3, wherein the second track is disposed on a side lower than the first track in a vertical direction.

5. The conveyance system according to claim 1, wherein the first carrier is configured to, in a case where one conveyance target is placed on the desired place to which another conveyance target being conveyed by the first carrier is to be conveyed, temporarily transfer the another conveyance target to the second carrier.

6. The conveyance system according to claim 3, wherein the second track is disposed at a position shifted from a position immediately below the first track in a vertical direction.

7. The conveyance system according to claim 6, wherein the transfer section includes a slide mechanism configured to allow the conveyance target to move in a horizontal direction.

8. The conveyance system according to claim 2, wherein, among a plurality of conveyance areas each of which includes a plurality of processing devices, a combination of conveyance areas across which the first track runs differs from a combination of conveyance areas across which the second track runs.

* * * * *